US008821677B2

(12) United States Patent
Ito et al.

(10) Patent No.: US 8,821,677 B2
(45) Date of Patent: Sep. 2, 2014

(54) HERMETIC CONTAINER AND MANUFACTURING METHOD OF THE SAME

(75) Inventors: Nobuhiro Ito, Yamato (JP); Mamo Matsumoto, Kawasaki (JP); Kazuya Ishiwata, Yokosuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 572 days.

(21) Appl. No.: 13/046,868

(22) Filed: Mar. 14, 2011

(65) Prior Publication Data

US 2011/0233103 A1 Sep. 29, 2011

(30) Foreign Application Priority Data

Mar. 29, 2010 (JP) ................................ 2010-075067

(51) Int. Cl.

| | |
|---|---|
| ***B65D 6/28*** | (2006.01) |
| ***B29C 65/00*** | (2006.01) |
| ***B29C 65/18*** | (2006.01) |
| ***H01J 9/26*** | (2006.01) |
| ***H01J 11/48*** | (2012.01) |
| ***H01J 31/12*** | (2006.01) |
| *H01L 51/52* | (2006.01) |

(52) U.S. Cl.

CPC ............ *H01J 9/261* (2013.01); *H01L 51/5246* (2013.01); *H01J 11/48* (2013.01); *H01J 31/123* (2013.01)

USPC ......................... 156/286; 156/292; 206/524.6

(58) Field of Classification Search

CPC ........... B65D 6/28; B65C 65/00; B65C 65/18

USPC ................................ 156/286, 292; 206/524.6

See application file for complete search history.

(56) References Cited

U.S. PATENT DOCUMENTS

| | | | |
|---|---|---|---|
| 5,426,631 | A | 6/1995 | Miyazaki et al. |
| 5,693,111 | A | 12/1997 | Kadowaki et al. |
| 5,722,031 | A | 2/1998 | Fujii et al. |
| 6,087,619 | A | 7/2000 | Berkmanns et al. |
| 6,109,994 | A | 8/2000 | Cho et al. |
| 6,113,450 | A | 9/2000 | Narayanan et al. |
| 6,517,399 | B1 | 2/2003 | Ito et al. |
| 6,817,917 | B1 | 11/2004 | Kado et al. |
| 6,926,571 | B2 | 8/2005 | Ito et al. |

(Continued)

FOREIGN PATENT DOCUMENTS

| | | |
|---|---|---|
| JP | 08-022767 A | 1/1996 |
| JP | 8-250021 A | 9/1996 |

(Continued)

*Primary Examiner* — Michael Orlando
*Assistant Examiner* — Daniel Lee
(74) *Attorney, Agent, or Firm* — Fitzpatrick, Cella, Harper & Scinto

(57) ABSTRACT

Adherence between a sealing material and a glass substrate is assured, thereby improving airtightness of a hermetic container. A manufacturing method of the hermetic container has: an assembling step of sealing a first glass substrate and a second glass substrate through a circumferential sealing material having plural straight line portions and plural coupling portions which connect the plural straight line portions so as to define an internal space between the first glass substrate and the second glass substrate; and a sealing step of maintaining the internal space to a negative pressure to an outside after the assembling step, applying such local force as to compress the coupling portions of the circumferential sealing material in a thickness direction of the sealing material, and heating and melting the sealing material by irradiating local heating light to the sealing material, to seal the first glass substrate and the second glass substrate.

11 Claims, 7 Drawing Sheets

(56) References Cited

U.S. PATENT DOCUMENTS

| | | | | |
|---|---|---|---|---|
| 7,039,303 | B2 | 5/2006 | Kimura et al. | |
| 7,110,665 | B2 | 9/2006 | Kamata et al. | |
| 7,362,038 | B1 | 4/2008 | Jang et al. | |
| 7,383,875 | B2 | 6/2008 | Yoshimura et al. | |
| 7,815,760 | B2 | 10/2010 | Kimura et al. | |
| 7,847,474 | B2 | 12/2010 | Seon | |
| 7,914,357 | B2 | 3/2011 | Koyanagi et al. | |
| 7,928,645 | B2 | 4/2011 | Suzuki et al. | |
| 7,972,461 | B2 | 7/2011 | Hasegawa et al. | |
| 8,038,498 | B2 | 10/2011 | Miyauchi et al. | |
| 8,425,714 | B2 * | 4/2013 | Ito et al. | 156/275.7 |
| 2005/0151151 | A1 | 7/2005 | Hawtof et al. | |
| 2005/0199599 | A1 | 9/2005 | Li et al. | |
| 2006/0082298 | A1 | 4/2006 | Becken et al. | |
| 2006/0084348 | A1 | 4/2006 | Becken et al. | |
| 2006/0244363 | A1 | 11/2006 | Seon et al. | |
| 2006/0289870 | A1 | 12/2006 | Hotta et al. | |
| 2007/0051499 | A1 | 3/2007 | Kaimura et al. | |
| 2007/0200476 | A1 | 8/2007 | Kijima et al. | |
| 2008/0110561 | A1 | 5/2008 | Lee et al. | |
| 2009/0000731 | A1 * | 1/2009 | Hasegawa et al. | 156/272.8 |
| 2009/0066215 | A1 | 3/2009 | Kweon | |
| 2009/0120915 | A1 | 5/2009 | Tagawa et al. | |
| 2009/0221207 | A1 | 9/2009 | Russell et al. | |
| 2009/0229745 | A1 * | 9/2009 | Lee et al. | 156/272.8 |
| 2010/0186350 | A1 | 7/2010 | Nakazawa et al. | |
| 2010/0190408 | A1 | 7/2010 | Kamiguchi et al. | |
| 2010/0190409 | A1 | 7/2010 | Kamiguchi et al. | |
| 2011/0249376 | A1 | 10/2011 | Wu | |

FOREIGN PATENT DOCUMENTS

| | | | |
|---|---|---|---|
| JP | 9-208270 | A | 8/1997 |
| JP | 2002-137939 | A | 5/2002 |
| JP | 2002-515392 | A | 5/2002 |
| JP | 2007-234334 | A | 9/2007 |
| JP | 2008-059781 | A | 3/2008 |
| JP | 2009-070687 | A | 4/2009 |
| JP | 2009-104841 | A | 5/2009 |
| JP | 2009-196859 | A | 9/2009 |

* cited by examiner

HERMETIC CONTAINER AND MANUFACTURING METHOD OF THE SAME

BACKGROUND OF THE INVENTION

1. Field of the Invention

The present invention relates to a manufacturing method of a hermetic container and, more particularly, to a manufacturing method of a hermetic container for an image display apparatus having electron-emitting devices in each of which an inside is held in a vacuum state and a phosphor film.

2. Description of the Related Art

Image display apparatuses of a flat panel type such as organic LED display (OLED), field emission display (FED), plasma display panel (PDP), and the like are well known. Each of those image display apparatuses is manufactured by forming an internal space by sealing glass substrates which face each other and has a container in which the internal space is partitioned to an external space. To manufacture such a hermetic container, a spacing distance defining member, a local adhesive, and the like are arranged between the facing glass substrates as necessary, a sealing material is arranged in a frame shape to peripheral portions of the glass substrates, and a heat sealing process is executed. As a heating method of the sealing material, a method whereby the whole glass substrates are baked by a furnace and a method whereby the sealing material is selectively heated and molten by local heating have been known. The local heating is more advantageous than the whole heating from viewpoints of a time which is required to heat and cool, an energy which is required to heat, productivity, a prevention of thermal deformation of the hermetic container, a prevention of thermal deterioration of a function device arranged in the hermetic container, and the like. Particularly, a unit using a laser beam has been known as a unit for performing the local heating (local heating unit). Such a manufacturing method of the hermetic container can be also applied as a manufacturing method of a hermetic container (vacuum insulated grazing glass) which does not have a function device therein.

A seal-sealing method of a container which is used for an FED, a fluorescent electron tube (VFD), and the like has been disclosed in Japanese Patent Application Laid-Open No. H08-022767. First, a first glass substrate and a second glass substrate are position-matched through a sealing material (seal glass). Subsequently, the circumferential sealing material (seal glass) is locally heated by the local heating unit and the first glass substrate and the second glass substrate are temporarily fixed in at least two positions. After that, by heating them in a seal-sealing furnace, the first glass substrate and the second glass substrate are seal-sealed.

A manufacturing method of a container of an FED has been disclosed in U.S. Pat. No. 6,109,994. First, a frame member and a sealing material (frit) are arranged in circumferential edge portions of the first glass substrate and the second glass substrate arranged so as to face each other. The sealing material has venting slots for exhaustion. Subsequently, a laser beam is intermittently irradiated along the extending direction of the sealing material, the sealing material is discretely heated, and discrete portions are sealed. Subsequently, the laser beam is continuously irradiated to the whole circumference of the sealing material including partially sealed regions, and while embedding the venting slots between both of the glass substrates by thermally expanding the sealing material, the internal space is airtightly sealed.

A manufacturing method of a hermetic container has been disclosed in Japanese Patent Application Laid-Open No. 2009-070687. A sealing material is arranged in a gap portion between a first glass substrate and a second glass substrate and the sealing material is partially heated by a heating apparatus along the extending direction of the sealing material and is also pressurized. A pressurizing force of the sealing material is changed based on a height of sealing material at a heating position.

According to the methods in the related arts, there is a case where adherence between the sealing material and the glass substrate when the laser beam is irradiated is difficult to be assured due to an influence of the rough surfaces of the sealing material and the glass substrates or an influence of the rough surfaces which are caused by structures such as wirings and the like provided for the glass substrates. When the adherence deteriorates, there is a case where airtightness of the hermetic container deteriorates and the reliability is deteriorated.

FIG. 6A illustrates a state where a height of sealing material 901 for sealing two glass substrates 912 and 913 constituting a hermetic container is variable. FIG. 6B illustrates a state where wirings 920 for supplying an electric power to an inside of the hermetic container are arranged between the first glass substrate 912 and the second glass substrate 913. As illustrated in FIGS. 6A and 6B, in the case where the sealing material 901 is locally heated and molten in a state where it is difficult to assure adherence between the sealing material 901 and the glass substrates 912 and 913, a leveling action of the sealing material is inferior to that in the case where the sealing material 901 is heated as a whole. Thus, it is liable to become a cause of a defective junction and cracks. It is, therefore, important that the adherence between the sealing material and the glass substrates is assured over the whole circumference of the sealing material during a step of irradiating a laser beam as a local heating unit and heating and melting the sealing material.

It is an object of the present invention to provide a manufacturing method of a hermetic container whereby adherence between a sealing material and glass substrates is assured and airtightness is improved.

SUMMARY OF THE INVENTION

A manufacturing method of a hermetic container according to the present invention has an assembling step and a sealing step. In the assembling step, a first glass substrate and a second glass substrate are aligned through a circumferential sealing material having plural straight line portions and plural coupling portions which connect the plural straight line portions so as to define an internal space between the first glass substrate and the second glass substrate. In the sealing step which is executed after the assembling step, the internal space is maintained to a negative pressure to an outside, such local force as to compress the coupling portions of the circumferential sealing material in a thickness direction of the sealing material is applied, and the sealing material is heated and molten by irradiating local heating light to the sealing material, thereby sealing the first glass substrate and the second glass substrate.

Further, a manufacturing method of a hermetic container according to the present invention has an assembling step, a step of setting an internal space to a negative pressure, and a sealing step. In the assembling step, while a circumferential sealing material constituted by plural straight line portions and plural coupling portions is sandwiched between a frame member and a first glass substrate, the first glass substrate and a second glass substrate are arranged so as to face each other through the frame member, and an internal space is defined between the first glass substrate and the second glass substrate. In the sealing step which is executed after the assembling step, the internal space is maintained to a negative pressure to an external space. In the sealing step, local force is applied in a thickness direction of the sealing material so as to decrease a distance increased between the sealing material and the first glass substrate by the step of maintaining the internal space to the negative pressure to the external space, and the sealing material is molten by moving a local heating unit along the sealing material, thereby sealing the first glass substrate and the second glass substrate.

Furthermore, according to a hermetic container of the present invention, an internal space is defined by glass substrates which face each other and a circumferential sealing material which is sandwiched between the glass substrate pair, fixes the glass substrate pair, and is constituted by plural straight line portions and plural coupling portions, the internal space is set to a negative pressure than that of an external space, and the container has a second sealing material which exists in the external space, is surrounded by the intersecting straight line portions of the sealing material, and fixes the glass substrate pair in a region including an extension line of a diagonal line connecting the two coupling portions having a diagonal positional relation.

According to the present invention, adherence between the sealing material and the glass substrates is assured, and airtightness of the hermetic container can be improved.

Further features of the present invention will become apparent from the following description of exemplary embodiments with reference to the attached drawings.

DESCRIPTION OF THE EMBODIMENTS

An embodiment of the present invention will be described hereinbelow with reference to the drawings. Although a container which is used as a hermetic container in image display apparatuses such as FED, OLED, PDP and the like will be described hereinbelow, the hermetic container of the present invention is not limited to them but can be applied to all containers which are airtightly sealed. There is a vacuum insulated grazing glass container as an example of such a hermetic container.

In particular, a manufacturing method of the hermetic container according to the present invention can be desirably applied to a manufacturing method of a container having a pressure-reduced internal space. In the image display apparatus such as an FED or the like having the pressure-reduced internal space, a joining strength which can cope with an atmospheric pressure caused by a negative pressure of the internal space is required. However, according to the manufacturing method of the hermetic container according to the present invention, both an assurance of the joining strength and an airtightness of the internal space can be accomplished.

Figure 7:
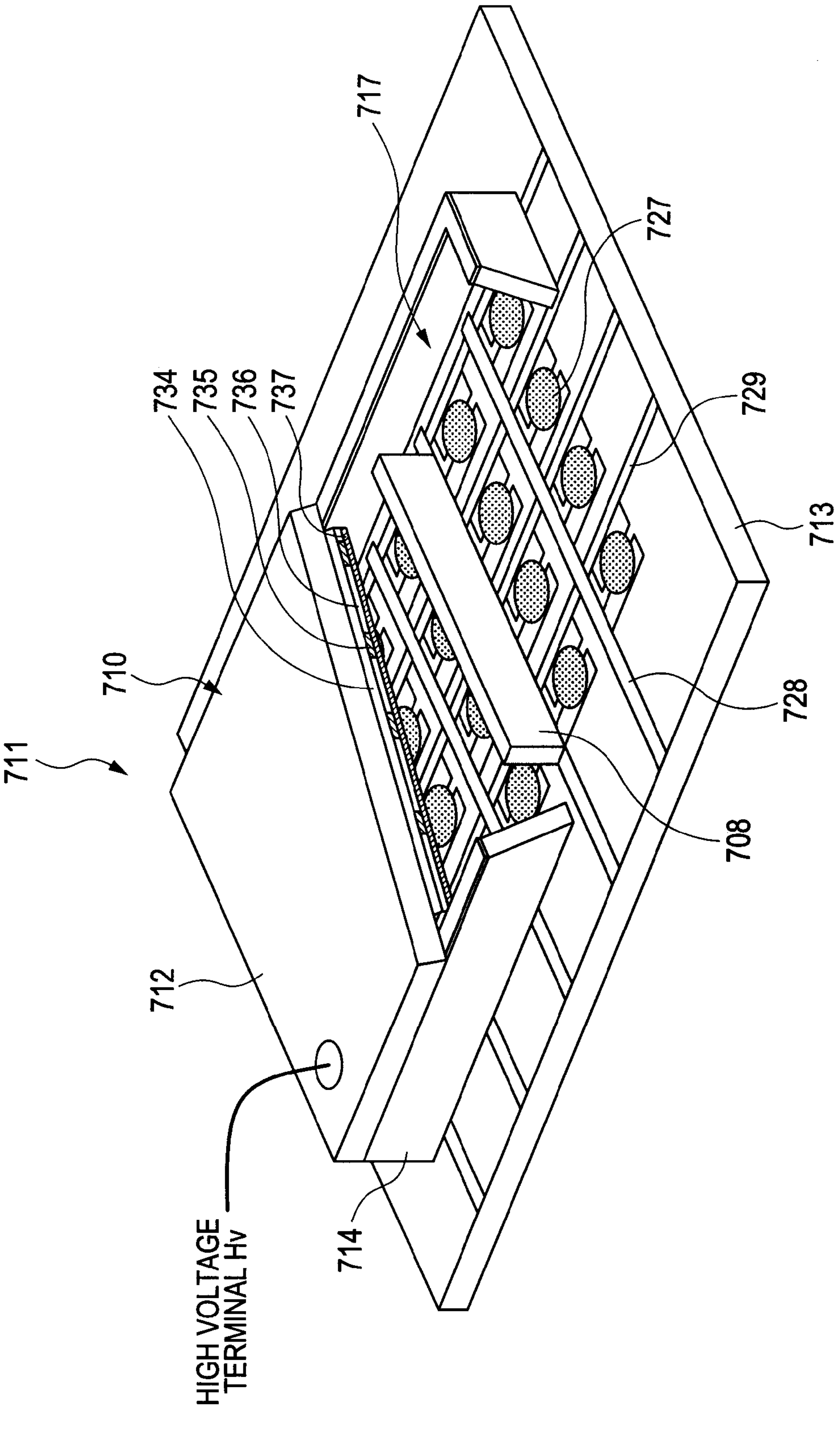
FIG. 7 is a cross sectional perspective view illustrating a constitution of an FED to which the manufacturing method of the hermetic container according to the present invention is applied.

FIG. 7 is a perspective view with a part cut away illustrating an example of an image display apparatus having the hermetic container of the present invention. A container (hermetic container) 710 of an image display apparatus 711 has a face plate 712, a rear plate 713, and a frame member 714, each of which is made of glass. The frame member 714 is arranged between the face plate 712 in a flat plate shape and the rear plate 713 in a flat plate shape, and a sealed internal space 717 is formed between the face plate 712 and the rear plate 713. Concretely, the face plate 712 and the frame member 714 and the rear plate 713 and the frame member 714 are respectively sealed in such a manner that their facing surfaces are sealed through a sealing material, so that the container 710 having the sealed internal space 717 is formed. The internal space 717 of the container 710 is maintained in a vacuum state. Spacing distance defining members (spacers) 708 which define a spacing distance between the face plate 712 and the rear plate 713 are provided at a predetermined pitch. The face plate 712 and the frame member 714 or the rear plate 713 and the frame member 714 may be preliminarily sealed or may be integrally formed.

A number of electron-emitting devices 727 for emitting electrons in response to an image signal are provided on the rear plate 713. Matrix wirings (X-directional wirings 728, Y-directional wirings 729) for making each electron-emitting device 727 operative in response to the image signal are formed on the rear plate 713. A phosphor film 734 made of phosphor which receives an irradiation of the electrons emitted from the electron-emitting devices 727, emits light, and displays an image is provided on the face plate 712 located so as to face the rear plate 713. Black stripes 735 are further provided on the face plate 712. The phosphor film 734 and the black stripes 735 are alternately arranged. A metal back 736 made of an aluminum (Al) thin film is formed on the phosphor film 734. The metal back 736 has a function as an electrode for attracting the electron and receives a supply of an electric potential from a high voltage terminal Hv provided for the container 710. A non-evaporable getter 737 made of a titanium (Ti) thin film is formed on the metal back 736.

It is sufficient that the face plate 712, rear plate 713, and frame member 714 are transparent and have translucency. Soda-lime glass, glass having a high strain point, no-alkali glass, or the like can be used. It is desirable that at a wavelength of local heating light and in an absorption wavelength band of the sealing material, which will be described hereinbelow, it is desirable that those members 712, 713 and 714 have a good translucency. The rear plate 713 is desirable from a viewpoint of suppressing a residual stress to the hermetic container so long as it is a material whose linear expansion coefficient coincides with that of each of the frame member 714 and the face plate 712.

Subsequently, the manufacturing method of the hermetic container according to the present invention will be described with reference to FIGS. 1A to 1D. Each of FIGS. 1A to 1D illustrating a stage of each step includes two diagrams. A plan view when the whole circumferential sealing material is seen is illustrated on the right side. A cross sectional view which perpendicularly crosses the surface of the face plate is illustrated on the left side. The manufacturing method of the hermetic container has an assembling step and a sealing step.

A first glass substrate and a second glass substrate constituting the hermetic container are prepared as a preparation stage.

A specific example of each component member constituting the hermetic container will be described hereinbelow. First, the face plate 712 having phosphor (not illustrated), the black stripes, and the metal back, the frame member 714, and the rear plate 713 are prepared. A glass frit (not illustrated) is formed onto the phosphor-formed surface of the face plate 712 by a printing and a baking. The glass frit and the frame member 714 come into contact with each other, are temporarily assembled by a pressurizing member (not illustrated), and are airtightly sealed and integrated in an atmospheric firing furnace. The first glass substrate in which the frame member 714 and the face plate 712 have been integrated in this manner is prepared. A sealing material 701 made of the glass frit is formed in the portion of the frame member 714 of the face plate (first glass substrate) 712 integrated with the frame member 714 by the printing and the baking.

The sealing material 701 which seals the first glass substrate with a second glass substrate, which will be described hereinafter, is a circumferential sealing material having plural straight line portions 701*a* and curved coupling portions 701*b* for connecting the straight line portions 701*a* (refer to FIG. 1A). Although the circumferential sealing material 701 has an almost rectangular frame shape on the assumption that the hermetic container is used as a container for the image display apparatus in the embodiment, the circumferential sealing material 701 is not limited to such a shape but may have an arbitrary polygonal frame shape.

The straight line portion 701*a* indicates a rectangular region surrounded by both rectilinearly extending edge sides of the sealing material. The coupling portion 701*b* indicates a transition region adapted to shift from one straight line portion to another straight line portion (refer to FIG. 1A). Although the coupling portion 701*b* is bent along a smooth curve in the examples illustrated in FIGS. 1A to 1D, the coupling portion may have a shape bent at an arbitrary angle. In this case, for example, the coupling portion has a square or rectangular shape in which two adjacent sides are connected to the straight line portion. Although each boundary line between the straight line portion 701*a* and the coupling portion 701*b* is illustrated for convenience of description in FIG. 1A, actually, the circumferential sealing material 701 is integrally formed (this is true of FIGS. 3A to 3E and FIGS. 6A to 6F).

The matrix wirings constituted by the plural X-directional wirings 728 and the plural Y-directional wirings 729 illustrated in FIG. 7 and the electron-emitting devices connected to intersecting portions of the matrix wirings are provided for the rear plate (second glass substrate) 713.

The frame member 714, the sealing material 701, and the like may be formed on the face plate 712 in arbitrary order. It is not always necessary to previously integrate those members but the frame member 714 and the face plate 712 may be sealed after or during a sealing step, which will be described hereinafter. In the above example, a matter in which the frame member 714 and the face plate 712 were integrated has been used as a first glass substrate, and the rear plate 713 has been used as a second glass substrate. However, the face plate 712 may be used as a first glass substrate and a matter in which the frame member 714 and the rear plate 713 were integrated may be used as a second glass substrate.

Although the sealing material 701 has been printed and formed onto the frame member 714, a sheet frit or the like serving as a sealing material 701 can be also arranged between the frame member 714 and the rear plate 713 in place of such a method. As for the sealing material 701, it is desirable that its viscosity has a negative temperature coefficient (temperature dependency), the material is softened at a high temperature, and its softening point is lower than that of each of the face plate 712, rear plate 713, and frame member 714. As an example of the sealing material 701, a glass frit, an inorganic adhesive, an organic adhesive, or the like can be mentioned. It is desirable that the sealing material 701 shows high absorbability to a wavelength of the local heating light, which will be described hereinafter. In the case where the hermetic container 710 is used as a container or the like for an FED in which it is required to maintain a vacuum degree of the internal space 717, a glass frit, an inorganic adhesive, or the like which can suppress a decomposition of residual hydrocarbon is desirably used as a sealing material 701.

Figure 1A:
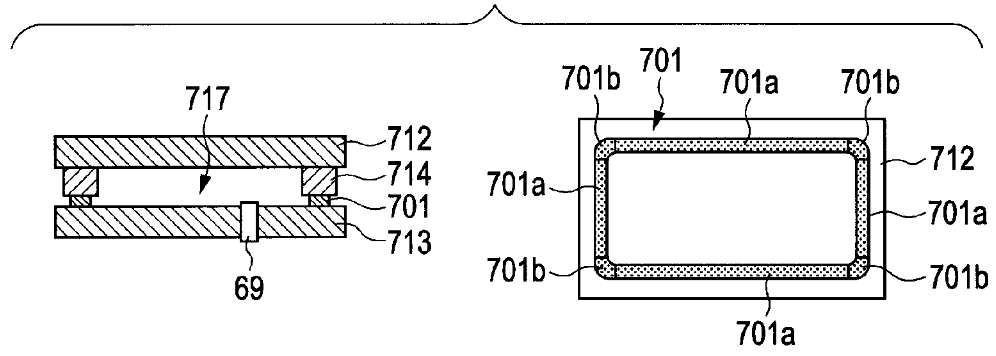
FIGS. 1A, 1B, 1C and 1D are cross sectional views and plan views illustrating examples of a manufacturing method of a hermetic container according to an embodiment of the present invention.

In the assembling step, as illustrated in FIG. 1A, the first glass substrate 712 and 714 and the second glass substrate 713 are sealed through the circumferential sealing material 701 having the plural straight line portions 701*a* and the plural coupling portions 701*b* for connecting the plural straight line portions 701*a*. In this manner, the internal space 717 is defined between the first glass substrate 712 and 714 and the second glass substrate 713. In the assembling step, it is desirable that the spacers 708 are arranged as spacing distance defining members so that a state where the internal space 717 has been maintained to a negative pressure to the outside can be assured during the sealing step, which will be executed later (also refer to FIGS. 2A and 2B).

There is a case where the members (the first glass substrate, the second glass substrate, and the whole sealing material) which define the internal space 717 in the state where the foregoing component elements have been assembled in the assembling step are called "assembly structure" hereinbelow.

In the sealing step after the assembling step, such local force as to set the internal space 717 to the negative pressure to the outside and to compress the coupling portions 701*b* of the circumferential sealing material 701 in the thickness direction of the sealing material is applied. At the same time, the sealing material 701 is heated and molten by irradiating the local heating light to the sealing material 701, thereby sealing the first glass substrate and the second glass substrate.

Figure 1B:
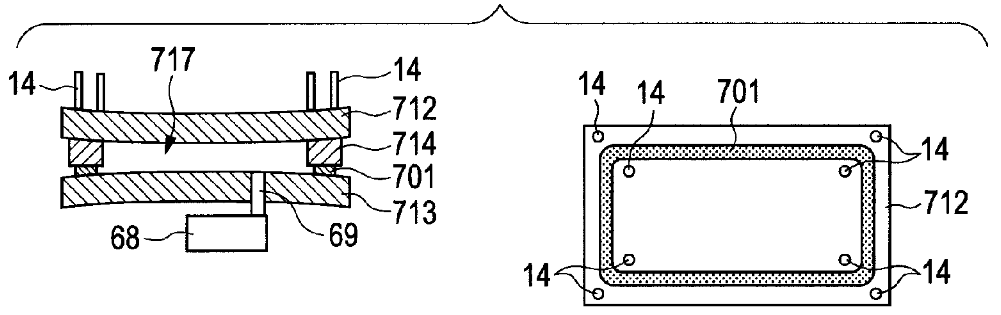
Figure 2A:
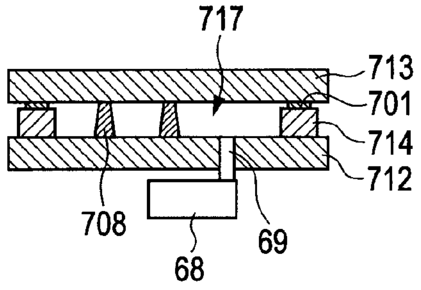
FIGS. 2A, 2B, 2C and 2D are cross sectional views illustrating a method of setting an internal space to a negative pressure in a sealing step in the embodiment of the present invention.
Figure 2B:
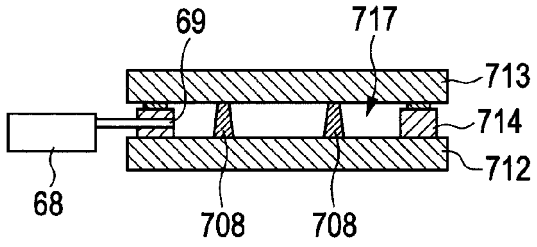

In order to set the internal space 717 to the negative pressure to the outside, for example, as illustrated in FIGS. 1B, 2A and 2B, the assembly structure is arranged in the ambient atmosphere and the air in the internal space 717 is exhausted by an arbitrary evacuating apparatus 68 through an exhaust hole (including an exhaust pipe) 69. The exhaust hole 69 to exhaust the air in the internal space 717 may be formed in the rear plate 713 as illustrated in FIG. 1A or may be formed in the face plate 712 as illustrated in FIG. 2A. Moreover, the exhaust hole 69 may be formed in the face plate 714 as illustrated in FIG. 2B. In this manner, the position of the exhaust hole can be arbitrarily selected to any position from the members constituting the hermetic container in accordance with a use form and an application of the hermetic container. By reducing a pressure in the internal space 717 as mentioned above, a pressure difference from the outside atmospheric pressure is caused. By such a pressure difference, the assembly structure is pressurized from the outside. By pressurizing the assembly structure from the outside by using the atmospheric pressure, there is such an advantage that even if there are micro concave/convex portions (variation) on an interface between the first glass substrate and the second glass substrate, the pressurizing force corresponding to a height of micro concave/convex portions is applied to the sealing material 701. Thus, an adherence between the first glass substrate and the second glass substrate is improved.

Although an air volume displacement of the internal space 717 by the evacuating apparatus 68 can be set according to the expected pressurizing force, by setting the pressure in the internal space 717 to 0.5 atmospheric pressure or less, much desirably, 0.1 atmospheric pressure or less, the sufficient pressurizing force can be assured. As an evacuating apparatus 68 for exhausting the internal space 717, an arbitrary apparatus such as dry scroll pump, rotary pump, thermal diffusion pump, turbo-molecular pump, or the like can be used. If it is demanded to prevent contamination of the internal space 717 of the hermetic container, the dry scroll pump or the turbo-molecular pump can be desirably used.

Figure 2C:
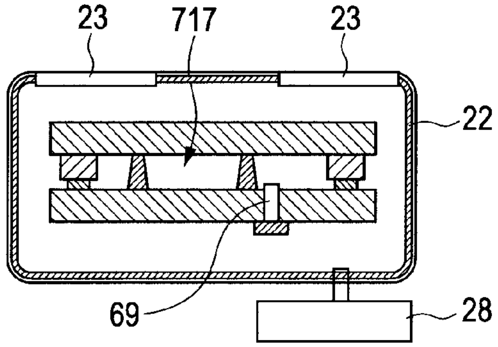
Figure 2D:
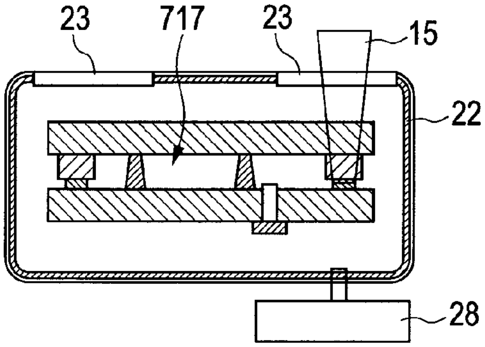

In the foregoing embodiment, in the sealing step, by reducing the pressure in the internal space 717, the internal space 717 is maintained to the negative pressure to the outside. However, the internal space 717 may be set to the negative pressure by increasing the outside atmospheric pressure. Such examples are illustrated in FIGS. 2C and 2D. As illustrated in FIG. 2C, after the assembling step, the hermetic container (assembly structure) whose exhaust hole 69 has been closed is inserted into a pressure container 22 and the atmospheric pressure in the pressure container 22 is increased by a pressurizing apparatus 28. Windows 23 made of quartz for transmitting local heating light, which will be described hereinafter, are formed in the pressure container 22. Thus, as illustrated in FIG. 2D, a light source of local heating light 15 is disposed in the outside of the pressure container 22 and the local heating light 15 can be irradiated to the assembly structure in the pressure container 22.

A specific example of a method of applying such local force to compress the coupling portions 701*b* of the circumferential sealing material 701 in the thickness direction of the sealing material will be described hereinbelow with reference to FIG. 1B. In this example, such local force as to compress the coupling portions 701*b* of the circumferential sealing material 701 is applied by a pressurizing tool 14. Thus, as for the force adapted to compress the sealing material 701, the force to the coupling portion 701*b* is larger than that to the straight line portion 701*a* of the sealing material.

Figure 1C:
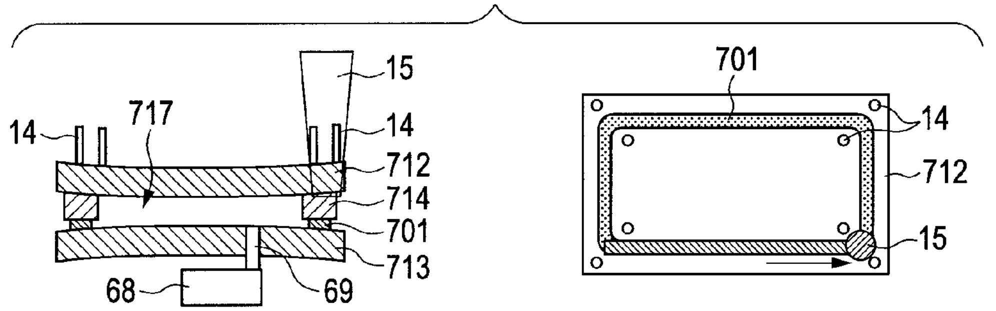
Figure 3A:
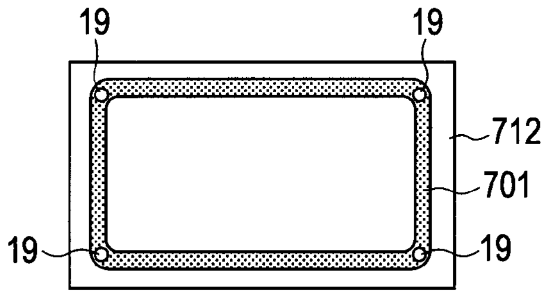
FIGS. 3A, 3B, 3C, 3D and 3E are plan views and enlarged plan views illustrating a method of selectively pressurizing a portion near a coupling portion of a sealing material in the sealing step in the embodiment of the present invention.
Figure 3B:
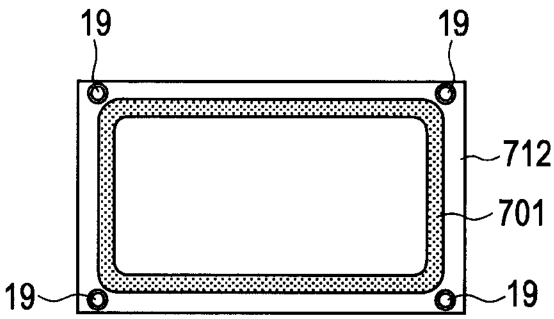

The position where the local force is applied is not limited to the positions on both sides which sandwich the sealing material as illustrated in FIG. 1C but may be set to positions 19 on the coupling portions 701*b* of the sealing material as illustrated in FIG. 3A, outside positions 19 of the coupling portions 701*b* of the sealing material as illustrated in FIG. 3B, or the like. In any of the above cases, those positions are located in corner portions of the glass substrates 712 and 713. In the corner portions, such local force as to compress the coupling portions 701*b* of the circumferential sealing material in the thickness direction of the sealing material can be applied.

Figure 3C:
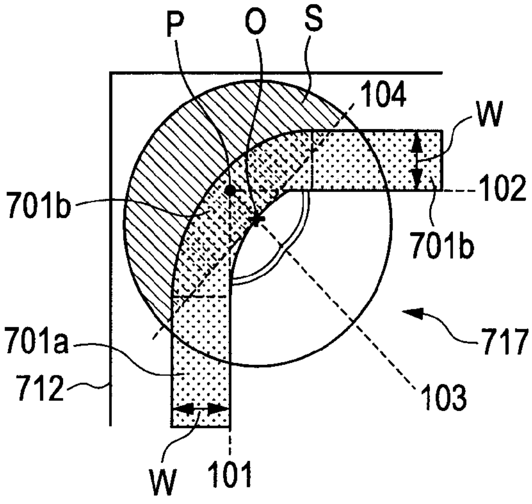

As illustrated in FIG. 3A, in the case of applying the local force to the positions on the coupling portions 701*b* of the sealing material, it is also possible to constitute in such a manner that after the assembling step and before the sealing step, the sealing material 701 is preliminarily locally heated and molten and, thereafter, solidified and the first glass substrate and the second glass substrate are locally sealed. Further, the present invention also incorporates a case where, as illustrated in FIG. 3E, when the circumferential sealing material 712 is formed, a sealing material 771 is previously arranged in the outside of the coupling portions 701*b* of the sealing material, further, prior to the sealing step of sealing the circumferential sealing material over one circumference, the sealing material 771 is locally sealed, and the glass substrate and regions near the coupling portions of the sealing material 701 are restricted. Also in this case, by the local junction of the sealing material 771, such local force as to compress the regions near the coupling portions of the sealing material 701 in the thickness direction of the sealing material is applied.

Figure 3D:
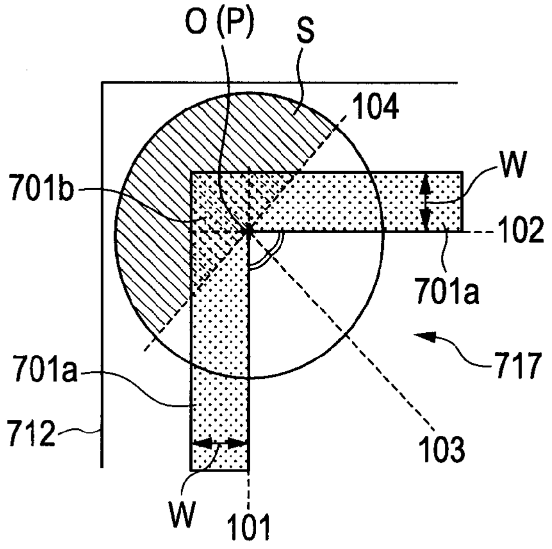
Figure 3E:
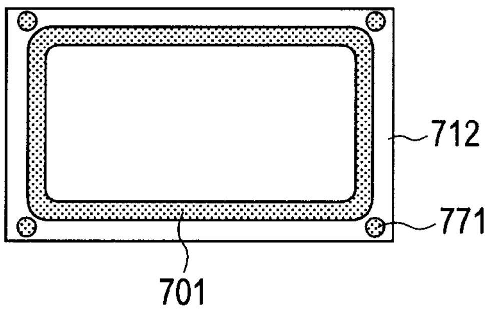

As illustrated in FIGS. 3D and 1B, in the case of applying the local force to the outside positions of the coupling portions 701*b* of the sealing material, another sealing material (local sealing material) which locally comes into contact with both of the first glass substrate and the second glass substrate in the assembling step may be preliminarily provided. In this case, by melting and solidifying such a sealing material before the sealing step, such local force as to compress the regions near the coupling portions of the sealing material in the thickness direction of the sealing material can be applied. Although it is not always necessary that the local sealing material is the same material as that of the sealing material 701, there is such an advantage that by using the same sealing material, the step of forming the sealing material is simplified.

Figure 6A:
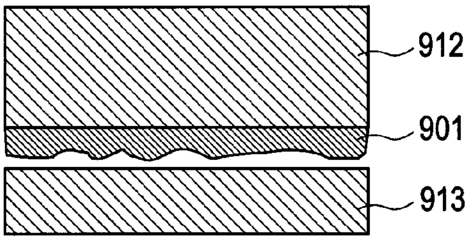
FIGS. 6A, 6B, 6C, 6D, 6E and 6F are cross sectional views and plan views of the hermetic container for describing a problem to be solved by the present invention.
Figure 6B:
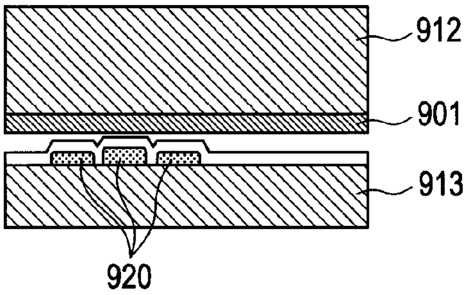
Figure 6C:
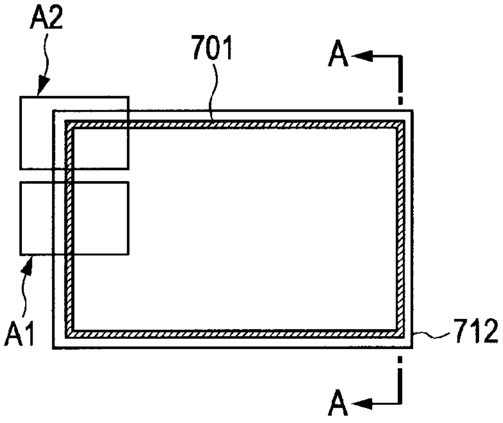
Figure 6D:
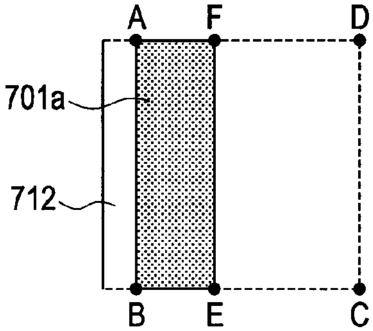
Figure 6E:
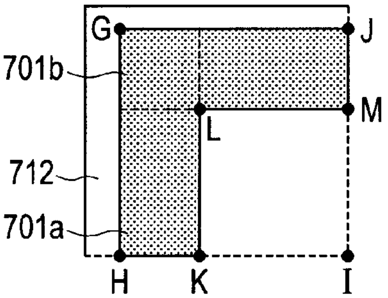

The inventors of the present invention have found out that by applying the local force to the coupling portions 701*b* of the sealing material as mentioned above, an effect which will be described hereinbelow is obtained. The force which is applied to the assembly structure from the outside thereof is applied to the sealing material 701. FIG. 6C illustrates a plan view of the face plate 712. FIG. 6D illustrates a region (region A1 in FIG. 6C) near the straight line portion 701*a* of the sealing material. FIG. 6E illustrates a region (region A2 in FIG. 6C) near the coupling portion 701*b* of the sealing material. When the assembly structure receives a pressure P from the outside, a pressure strength F of the force which is applied to the sealing material 701 in the diagram is equal to P×S2/S1. Here, "S1" denotes an area of the region where the pressure is applied in a predetermined region, and "S2" denotes an area of the sealing material which occupies the inside of the predetermined region. Therefore, S2/S1 denotes an area ratio in which the area S2 which receives the pressure from the outside has been standardized by the area S1 of the sealing material. Although P is an arbitrary pressure, it may be considered as an atmospheric pressure in the case of setting the internal space to the negative pressure as mentioned above. Although the area ratio S2/S1 near the straight line portion 701*a* of the sealing material is equal to FECD/ABEF (refer to FIG. 6D), the area ratio near the coupling portion 701*b* of the sealing material is equal to LKIM/GHKLMJ (refer to FIG. 6E). That is, the area ratio near the coupling portion 701*b* is smaller than the area ratio near the straight line portion 701*a*. Because of such a reason, even if the internal space 717 is merely set to the negative pressure to the outside, the pressurizing force to, particularly, the region near the coupling portion 701*b* in the circumferential sealing material 701 lacks relatively.

Figure 6F:
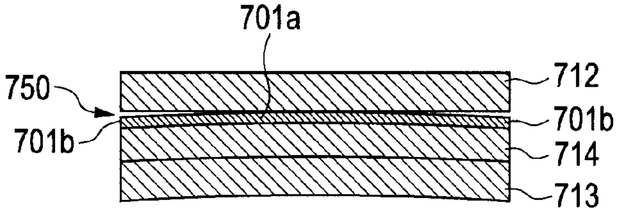

An example of the assembly structure in the case where the pressurizing force to the region near the coupling portion 701*b* is insufficient is illustrated in FIG. 6F. FIG. 6F is a schematic cross sectional view of the assembly structure taken along the A-A line in FIG. 6C. When the internal space 717 is maintained to the negative pressure, the adherence can be almost uniformly assured over the whole straight line portion 701*a* of the sealing material 701. However, the inventors of the present invention and the like have found out that even if the internal space 717 is merely set to the negative pressure, the adherence between the coupling portion 701*b* of the sealing material and the rear plate 713 is low and there is a case where a venting slot 750 occurs and a defective junction occurs near the coupling portion 701*b*.

As mentioned above, since the strength of the region near the coupling portion 701*b* of the sealing material is larger than the that near the straight line portion 701*a*, there is a case where if the coupling portion 701*b* of the sealing material is not pressurized by the force larger than that to the straight line portion 701*a* of the sealing material, the defective junction occurs near the coupling portion 701*b* of the sealing material. According to the present invention, since such local force as to compress the coupling portions 701*b* of the circumferential sealing material in the thickness direction of the sealing material is applied, the adherence between the first glass substrate and the second glass substrate can be improved.

From a viewpoint of improvement of the adherence, it is desirable to apply such local force as to compress all of the coupling portions 701*b* of the sealing material in the sealing step.

Subsequently, in the sealing step, a region where the local force is applied (pressurizing region) will be described with reference to FIGS. 3C and 3D. The sealing material 701 is arranged so as to surround the internal space 717. In FIGS. 3C and 3D, two adjacent sides of the straight line portion 701*a* of the sealing material are connected by one coupling portion 701*b*. FIG. 3D illustrates an example in the case where the coupling portion 701*b* is not bent by a smooth curve but has a square shape (or a rectangular shape).

In FIGS. 3C and 3D, reference numeral 101 denotes a first edge side on the internal space side of one of the two straight line portions 701*a* extending from one coupling portion 701*b*. Reference numeral 102 denotes a second edge side on the internal space side of another one of the two straight line portions 701*a* extending from one coupling portion 701*b*. An intersection point of those edge sides 101 and 102 is assumed to be P. A bisector (which passes through the intersection point P) in which an angle between the two edge sides 101 and 102 is divided into two equal parts is illustrated. A circle having a radius R in which a point O where the bisector 103 crosses the coupling portion 701*b* of the sealing material is a center is considered. A line 104 which passes through the point O and is perpendicular to the bisector is considered. At this time, in the sealing step, it is desirable that the pressurizing region where the local force is applied is an inside region of the circle of the radius R and is at least a part of an outside region S of the perpendicular line 104 to the internal space 717. In the case where widths W of plural straight line portions are the same, it is desirable that the radius R of the foregoing circle is equal to a value which is three or less times (that is, 3W or less) as large as the width (indicated by W in FIGS. 3C and 3D) of the straight line portion 701*a* of the sealing material.

Even if the coupling portion of the sealing material has vertically been bent as illustrated in FIG. 3D, the pressurizing region where the local force is applied can be defined in substantially the same manner as that mentioned above. In this case, the intersection point P of the first edge side 101 on the internal space 717 side of one of the two straight line portions and the second edge side 102 on the internal space 717 side of the other straight line portion is located on an edge portion of the sealing material 701. Therefore, when considering the circle of the radius R, the center O of the circle of the radius R and the intersection point P coincide.

As described above, by setting the internal space 717 to the negative pressure to the outside and by applying such local force as to compress the coupling portions 701*b* of the circumferential sealing material in the thickness direction of the sealing material, the lack of the pressurizing force in the region near the coupling portion 701*b* of the sealing material can be supplemented. Thus, the adherence between the whole circumference of the sealing material 701 and the glass substrate can be improved.

As for the timing for setting the internal space 717 to the negative pressure to the outside and the timing for starting to apply such local force as to compress the coupling portions 701*b* of the circumferential sealing material, those operations may be executed in arbitrary order or may be simultaneously started. In brief, it is sufficient that the negative pressure of the internal space 717 and the application of the local force are maintained during the sealing step, which will be described hereafter. However, in the case where it is difficult to set the internal space 717 to the negative pressure because of the lack of the adherence of the coupling portion 701*b* of the sealing material, it is much desirable that after such local force as to compress the coupling portions 701*b* of the circumferential sealing material was applied, the internal space 717 is set to the negative pressure.

In the sealing step, as for the state of the negative pressure of the internal space 717 and the application of such local force as to compress the coupling portions 701*b* of the sealing material, the local heating light is irradiated to the sealing material 701 and maintained for a period of time during which the first glass substrate and the second glass substrate are sealed. Desirably, the local heating light is scanned along the sealing material 701 and the sealing material 701 is sequentially heated and molten in the glass substrate surface.

The scanning of the local heating light will be described hereinbelow with reference to FIG. 1C with respect to specific examples. In the sealing step, the local heating light 15 is sequentially irradiated to the whole circumference of the sealing material 701, thereby heating and melting the sealing material 701. When the local heating light 15 has passed and the sealing material 701 has been cooled, the sealing material 701 is solidified and the first glass substrate (the face plate 712 with the frame member 714) and the second glass substrate (the rear plate 713) are sealed. By scanning the local heating light to the whole circumference of the sealing material 701, the sealing material 701 airtightly seals and seals the face plate 712 with the frame member 714 serving as a first glass substrate and the rear plate 713 serving as a second glass substrate over the whole circumference.

Figure 1D:
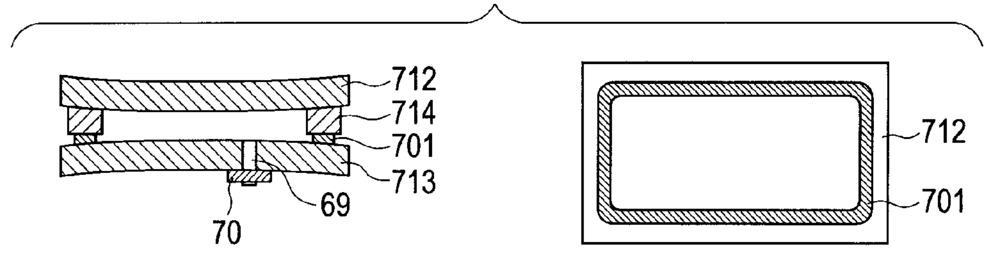

Subsequently, the local force applied to the coupling portions 701*b* of the sealing material is cancelled. After that, as illustrated in FIG. 1D, the exhaust hole 69 is sealed by a proper cover member 70 and the hermetic container can be manufactured.

In the case where the internal space 717 of the hermetic container is maintained in a vacuum state, it is sufficient that after the sealing step, the pressure reduction of the internal space of the hermetic container is cancelled, subsequently, a step of exhausting the gas in the internal space 717 is again executed, and thereafter, the exhaust hole 69 is sealed. In place of the foregoing method, the exhaust hole 69 may be sealed while maintaining the negative pressure of the internal space 717 during the sealing step.

Figure 4A:
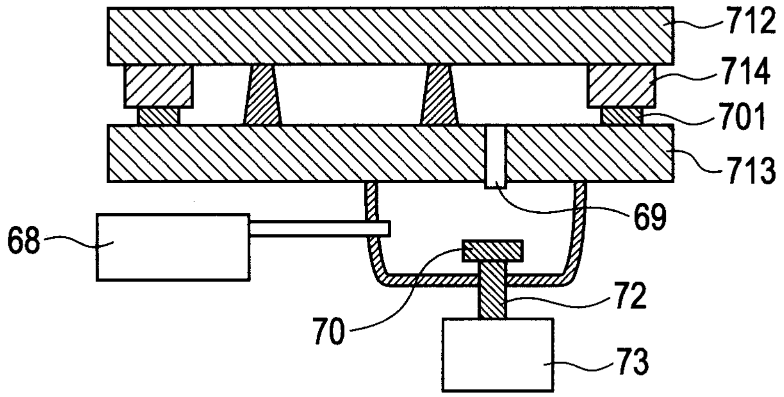
FIGS. 4A and 4B are cross sectional views illustrating examples of a sealing method of an exhaust hole in the case where the manufacturing method of the hermetic container according to the present invention is applied to a pressure-reduced hermetic container.

As an example of a method whereby the exhaust hole 69 is sealed by the cover member 70 while maintaining the internal space 717 in the vacuum state, a cover sealing apparatus may be used as illustrated in FIG. 4A. Concretely, the cover sealing apparatus has the cover member 70 having a sealing material (not illustrated), a mobile axis 72 which holds the cover member 70, and a moving apparatus 73 for moving the mobile axis 72. The evacuating apparatus 68 exhausts the inside of a hood which can airtightly seal the cover member 70 of the cover sealing apparatus and the exhaust hole 69.

Figure 4B:
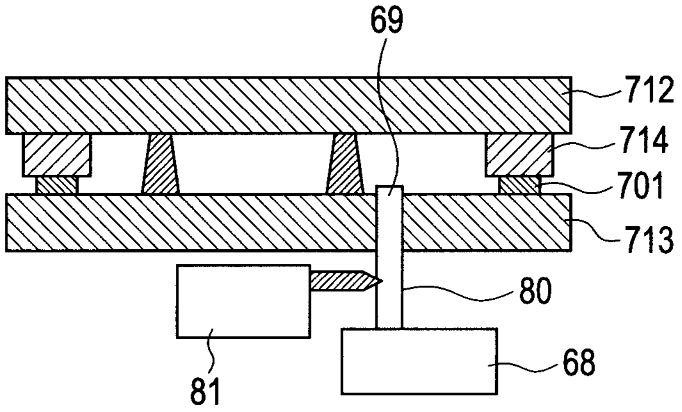

As another method of sealing the exhaust hole 69 while maintaining the internal space 717 in the vacuum state, as illustrated in FIG. 4B, it is also possible to constitute in such a manner that an exhaust pipe 80 extending from the exhaust hole 69 is tipped off by a tip-off apparatus 81 and the exhaust hole 69 is sealed. A gas burner, a heat gun, or the like can be used as a tip-off apparatus 81.

Hereinafter, concrete examples of the above-described embodiment will be described in detail.

FIRST EXAMPLE

In this example, the foregoing manufacturing method of the hermetic container is applied, an integrated matter of the frame member and the face plate and the rear plate are airtightly sealed, further, the pressurization is cancelled, and after that, while the internal space is again exhausted from the exhaust hole, the exhaust hole is sealed by the cover member. In this manner, a vacuum hermetic container which can be applied as a container for the FED is manufactured.

First, a face plate is prepared. The face plate is formed by cutting a high strain point glass substrate having a thickness of 1.8 mm (PD200: made by Asahi Glass Co., Ltd.) into a plate glass shape having an external shape of 980 mm×570 mm×1.8 mm by a cutting work. Subsequently, the surface of the face plate is degreased by an organic solvent cleaning, a pure water rinsing, and a UV-ozone cleaning. Then, by forming phosphor, a black matrix, and an anode as a pattern onto the face plate, an image forming region is formed onto one surface of the face plate. Subsequently, a non-evaporable getter made of metal Ti is formed onto the anode by a sputtering method. Then, a sealing material made of a glass frit is formed in the outside of the image forming region on the face plate by a screen printing and an atmosphere heating. In this manner, the face plate with the sealing material is prepared.

Subsequently, a frame member is prepared. Concretely, a high strain point glass substrate having a thickness of 1.5 mm (PD200) is cut into a size having an external shape of 980 mm×580 mm×1.5 mm. A region of 970 mm×560 mm×1.5 mm of a center region of the glass substrate having such a size is cut out by the cutting work, thereby forming the almost quadrangular frame member in which a straight line portion has a width of 5 mm and a height of 1.5 mm. Then, in a manner similar to the face plate, the surface of the frame member is degreased by the organic solvent cleaning, pure water rinsing, and UV-ozone cleaning.

Subsequently, the surface (having the phosphor pattern) of the prepared face plate with the sealing material and the frame member are come into contact with each other, are temporarily assembled by a pressurizing tool (not illustrated), and are sealed and integrated without gaps by an atmospheric firing furnace, thereby preparing the face plate (first glass substrate) with the integrated frame member.

Subsequently, the sealing material is formed on the frame member. In this example, a glass frit is used as a sealing material. The glass frit used is such a paste that a Bi system lead-free glass frit (BAS115: made by Asahi Glass Co., Ltd.) having a thermal expansion coefficient of $\alpha=79\times10^{-7}$/° C., a transition point of 357° C., and a softening point of 420° C. is used as a base material, and an organic substance is dispersed and mixed as a binder. Subsequently, a sealing material having a width of 1 mm and a thickness of 7 μm is formed along the circumferential length on the frame member by the screen printing. Each face plate with the integrated frame member serving as a first glass substrate is dried at 120° C. In order to burn out the organic substance, it is heated and baked at 460° C., thereby forming the sealing material. In this manner, an integrated matter of the sealing material, frame member, and face plate serving as a first glass substrate is prepared.

Subsequently, as a rear plate, a glass substrate having a size of 990 mm×580 mm×1.8 mm and made of high strain point glass (PD200: made by Asahi Glass Co., Ltd.) is prepared. Then, an exhaust hole having a diameter of 2 mm is formed in a region out of the image forming region of the rear plate by the cutting work. Subsequently, in a manner similar to the face plate and the frame member, after the rear plate was cleaned, the electron-emitting devices and the matrix wirings for driving (not illustrated) are formed. The non-evaporable getter made of a metal (Ti) (not illustrated) is formed on the matrix wirings for driving by the sputtering method. Subsequently, the spacers (not illustrated) are arranged on scanning signal wirings.

Subsequently, the prepared integrated matter of the sealing material, frame member serving as a first glass substrate, and face plate and the electron-emitting device plate are arranged in such a manner that the surface formed with the phosphor pattern and the surface formed with the electron-emitting device face each other. Thus, the assembly structure which defines the internal space 717 is formed as illustrated in FIG. 1A.

Subsequently, the evacuating apparatus comprising the scroll pump and the turbo-molecular pump is connected to the exhaust hole 69 through the exhaust pipe, thereby exhausting until the atmospheric pressure of the internal space 717 reaches $1\times10^{4}$ Pa as illustrated in FIG. 1B. As a result of the exhaustion, as illustrated in FIG. 6F, in each region near the four coupling portions 701*b*, the venting slot 750 occurs between the sealing material 701 and the face plate 712. The larger the venting slot increases in the bisection angle direction of the corner portion of the face plate as it is away from the center of the face plate. In this example, the venting slot of maximum 10 μm was confirmed.

Subsequently, as illustrated in FIG. 1B, while maintaining the vacuum degree of the internal space 717, the coupling portions 701*b* of the sealing material are selectively pressurized by a force of 0.5N from the face plate 712 side at every two positions per corner near each coupling portion 701*b* by using the pressurizing tools. A contact portion of the pressurizing tool 14 and the face plate 712 is protected by silicone rubber (not illustrated), thereby suppressing a damage of the face plate 712. The contact portion at this time is a circle having a diameter of 1 mm. It has been confirmed that by pressurizing each portion near the coupling portion 701*b* as mentioned above, the venting slot 750 caused by the reduction in pressure of an external space of the internal space due to the exhaustion decreased to the venting slot of maximum 1 μm.

Subsequently, while maintaining the pressurizing state to the assembly structure, as illustrated in FIG. 1C, the local heating light 15 is irradiated to the sealing material 701. The local heating light 15 sequentially scans the straight line portions 701*a* of four sides and the coupling portions 701*b* which constitute the sealing material 701, so that the rear plate 713 and the frame member 714 are airtightly sealed.

At this time, as for the local heating light 15, two semiconductor laser apparatuses for working (not illustrated) are prepared and arranged in such a manner that irradiation spots of a first laser light source and a second laser light source are aligned on a straight line.

As a first laser light source, a laser beam having a wavelength of 980 nm, a laser power of 212 W, and an effective diameter of 2 mm is used and scanned at a speed of 1000 mm/sec. The second laser light source is arranged behind the first laser light source in the scanning direction with a delay time of 0.05 seconds, that is, by a distance of 50 mm as an irradiation spot, and this spacing distance is also maintained during the scanning operation. At this time, as a laser beam from the second laser light source, a laser beam having a wavelength of 980 nm, a laser power of 212 W, and an effective diameter of 2 mm is used.

Subsequently, the pressurization of the pressurizing tool is released, the evacuating apparatus and the exhaust pipe are removed from the exhaust hole, and the pressure reduction of the internal space is cancelled. After that, while the internal space 717 is exhausted from the exhaust hole 69, the whole hermetic container is heated in a cart type furnace having a cover sealing apparatus as illustrated in FIG. 4A in the furnace. The internal space 717 is exhausted by the non-evaporable getter, the cover is sealed, and the vacuum hermetic container is completed.

The hermetic container is manufactured in this manner, a driving circuit and the like are further attached by an ordinary method, and an FED apparatus having the hermetic container is completed. The completed FED was made operative, so that it has been confirmed that the stable electron emission and image display for a long time can be performed and such stable airtightness that can be applied to the FED is assured.

SECOND EXAMPLE

Figure 5A:
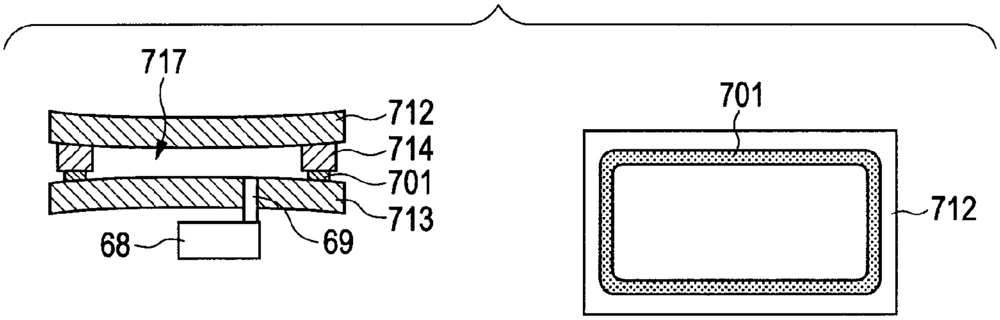
FIGS. 5A, 5B, 5C and 5D are cross sectional views and plan views illustrating examples of a manufacturing method of a hermetic container according to another embodiment of the present invention.
Figure 5B:
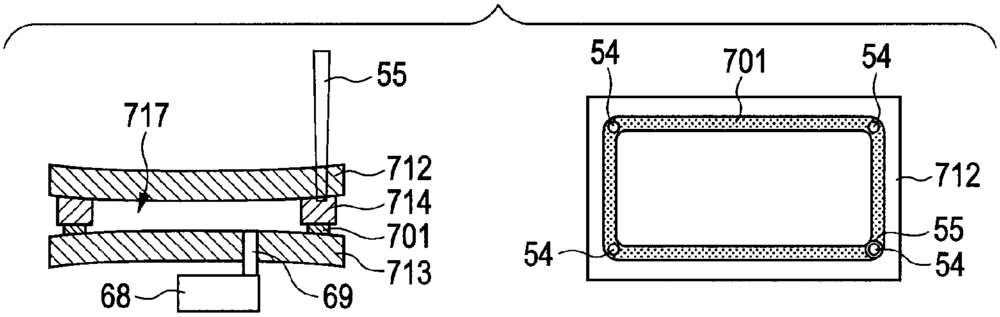
Figure 5C:
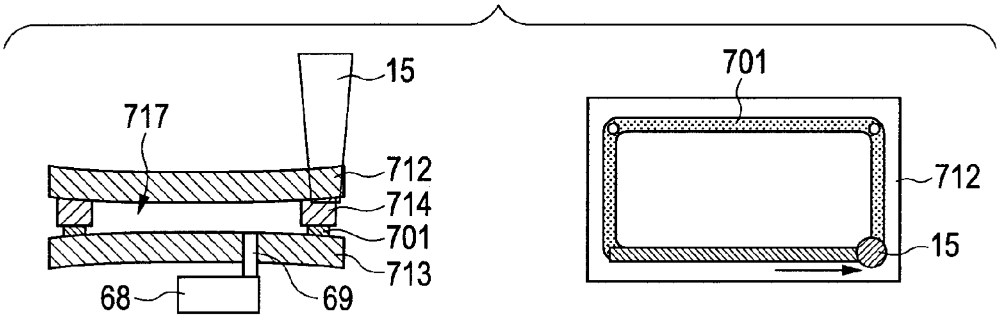
Figure 5D:
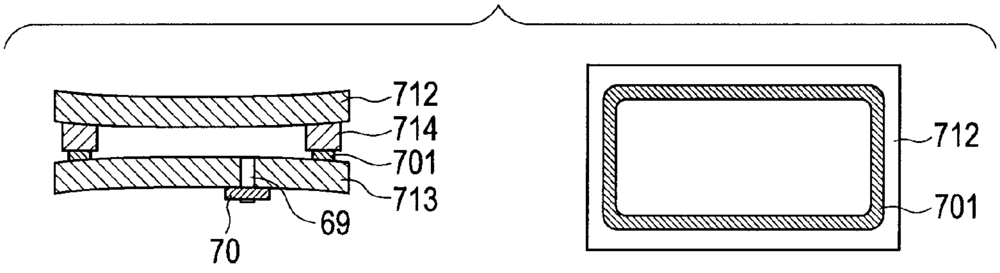

In the second example, as illustrated in FIGS. 5A to 5D, before the sealing step of sealing the circumferential sealing material over one circumference, a laser beam 55 is locally irradiated to the coupling portions 701*b* of the sealing material and the local sealing portions are formed (positions 54 in FIG. 5B). By such a local sealing, such local force as to compress the coupling portions of the sealing material 701 in the thickness direction can be applied. Processes including the operations for exhausting the internal space 717 and setting it to the negative pressure are executed in a manner similar to the first example except that after the coupling portions 701*b* of the sealing material were locally sealed, the sealing step is executed (refer to FIG. 5C). In this manner, the hermetic container which can be applied to the FED is formed. The completed FED was made operative, so that it has been confirmed that the stable electron emission and image display for a long time can be performed and such stable airtightness that can be applied to the FED is assured.

THIRD EXAMPLE

In the third example, processes are executed in a manner similar to the first example except that in place of pressurizing by the pressurizing tool 14 in the first example, as illustrated in FIG. 3E, when the circumferential sealing material 701 is formed, the sealing material 771 is preliminarily arranged and formed at four positions in the outside of the coupling portions 701*b* of the sealing material, and further, before the sealing step of sealing the circumferential sealing material over one circumference, the sealing materials 771 at four positions are sealed by the local heating light. In this manner, the hermetic container which can be applied to the FED is formed. The completed FED was made operative, so that it has been confirmed that the stable electron emission and image display for a long time can be performed and such stable airtightness that can be applied to the FED is assured.

While the present invention has been described with reference to exemplary embodiments, it is to be understood that the present invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-075067, filed Mar. 29, 2010, which is hereby incorporated by reference herein in its entirety.

What is claimed is:

1. A method of manufacturing a hermetic container, comprising steps of:

arranging a circumferential sealing member having a plurality of straight portions and a plurality of coupling portions in an alternate arrangement between a pair of glass members, so as to form an assembly structure having an internal space between the pair of glass members;

applying an entire pressurizing force to the circumferential sealing member along a thickness direction of the circumferential sealing member with a negative differential atmospheric pressure in the internal space relative to an exterior of the assembly structure;

applying a local pressing force to each of the plurality of the coupling portions along a thickness direction of the circumferential sealing member such that each of the plurality of the coupling portions is pressed with higher strength than the straight portions; and moving a local heating light spot of a local heating light along the circumferential sealing member during a period that the circumferential sealing member is applied with the entire pressurizing force and each of the plurality of the coupling portions is applied with the local pressing force.

2. The method according to claim 1, wherein the step of applying the local pressing force is performed such that the local force is applied to at least a part of an inside region of a circle having a radius of three times a width of the straight line portion in which a point where a bisector which divides an angle between a first edge side on an internal space side of one of the two straight line portions extending from each of the coupling portions and a second edge side on the internal space side of the other straight line portion into two equal parts crosses each of the coupling portions is set to a center, that is, an outside region of a line which passes through the center of the circle and is perpendicular to the bisector for the internal space.

3. The method according to claim 1, wherein the step of applying the local pressing force is performed by pressuring the coupling portions via the pair of glass members with a pressing tool.

4. The method according to claim 1, wherein the step of applying the local pressing force is performed by local bonding at an outer region of each of the coupling portions or at each of the coupling portions between the pair of glass members with a local heating light.

5. The method according to claim 1, wherein the step of applying the entire pressurizing force is performed by inserting the assembly structure into a pressure container and increasing an atmospheric pressure of an intermediate space located outside of the assembly structure and inside of the pressure container.

6. The method according to claim 1, wherein the step of applying the entire pressurizing force is performed by exhausting the internal space through an exhaust hole provided in one of the pair of glass members.

7. The method according to claim 6, further comprising a step of sealing the exhaust hole after the step of moving the local heating light spot.

8. The method according to claim 1, wherein a viscosity of the sealing material is negatively dependent with temperature.

9. A method of manufacturing an image display apparatus having a light emitting device, comprising steps of:

manufacturing a hermetic container according to claim 1; and providing a light emitting device on at least one of the pair of glass members before the arranging step.

10. A method of manufacturing a hermetic container, comprising steps of:

arranging a rectangular shaped sealing member having a plurality of straight portions and a plurality of corner portions between a pair of glass substrates, so as to form an assembly structure having an internal space between the pair of glass substrates;

applying an entire pressurizing force to the assembly structure along a thickness direction of the sealing member with a negative differential atmospheric pressure in the internal space relative to an exterior of the assembly structure;

applying a local pressing force to the assembly structure along a thickness direction of the sealing member at each of the plurality of corner portions of the sealing member such that each of the plurality of the corner portions is pressurized with higher strength than the straight portions; and scanning a local heating light spot of a local heating light along the sealing member during a period that the assembly structure is applied with the entire pressurizing force and the local pressing force.

11. A method of manufacturing an image display apparatus having a light emitting device, comprising steps of:

manufacturing a hermetic container according to claim 10; and providing a light emitting device on at least one of the pair of glass members before the arranging step.

* * * * *